(12) United States Patent
Iwamoto et al.

(10) Patent No.: US 6,649,883 B2
(45) Date of Patent: Nov. 18, 2003

(54) METHOD OF CALIBRATING A SEMICONDUCTOR WAFER DRYING APPARATUS

(75) Inventors: Yoshio Iwamoto, Utsunomiya (JP); James C. Lenk, O'Fallon, MO (US); Philip Schmidt, Harvester, MO (US); Craig Spohr, Kirkwood, MO (US); Leslie G. Stanton, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 47 days.

(21) Appl. No.: 09/834,118

(22) Filed: Apr. 12, 2001

(65) Prior Publication Data

US 2002/0148826 A1 Oct. 17, 2002

(51) Int. Cl.⁷ .............................. H05B 3/68; F26B 3/00
(52) U.S. Cl. .......................................... 219/494; 34/467
(58) Field of Search ................................ 219/490, 494, 219/509, 510, 497; 134/105, 106, 107; 34/467, 468, 470, 471, 72, 73, 75, 78

(56) References Cited

U.S. PATENT DOCUMENTS

| | | | | |
|---|---|---|---|---|
| 4,679,721 A | * | 7/1987 | Kondo | 134/105 |
| 5,443,540 A | * | 8/1995 | Kamikawa | 134/105 |
| 5,657,553 A | * | 8/1997 | Tarui et al. | 34/468 |
| 6,032,382 A | | 3/2000 | Matsumoto et al. | |
| 6,101,737 A | * | 8/2000 | Kinoshita | 134/108 |
| 6,138,690 A | | 10/2000 | Nakatani | |
| 6,287,380 B1 | * | 9/2001 | Falster et al. | 117/13 |
| 6,384,415 B1 | * | 5/2002 | Suzuki et al. | 250/341.4 |

FOREIGN PATENT DOCUMENTS

EP 0 663 685 2/1998

OTHER PUBLICATIONS

IPA Vapor Dryer, Operation and Maintenance Manual, Chapter 1, Revised: Nov. 12, 1993, S&K Products International, Chestnut Ridge, New York.

* cited by examiner

Primary Examiner—Sang Paik
(74) Attorney, Agent, or Firm—Senniger, Powers, Leavitt & Roedel

(57) ABSTRACT

A method for calibrating a semiconductor wafer drying apparatus including a heater and a vessel containing a solvent and capable of receiving semiconductor wafers comprises selecting a test heater temperature and a test processing time. A first set of wafers is placed in the vessel and the heater is operated at the test heater temperature so that a solvent vapor cloud is created in the vessel. The first set of wafers is monitored for substantial envelopment by the vapor cloud during the test processing time. Based on the monitoring step, at least one of the test heater temperature and the test processing time is adjusted to establish at least one operating parameter of an operating heater temperature parameter and an operating processing time parameter for processing successive sets of wafers so as to promote substantial vapor cloud envelopment of each set of wafers dried in the drying apparatus.

29 Claims, 1 Drawing Sheet

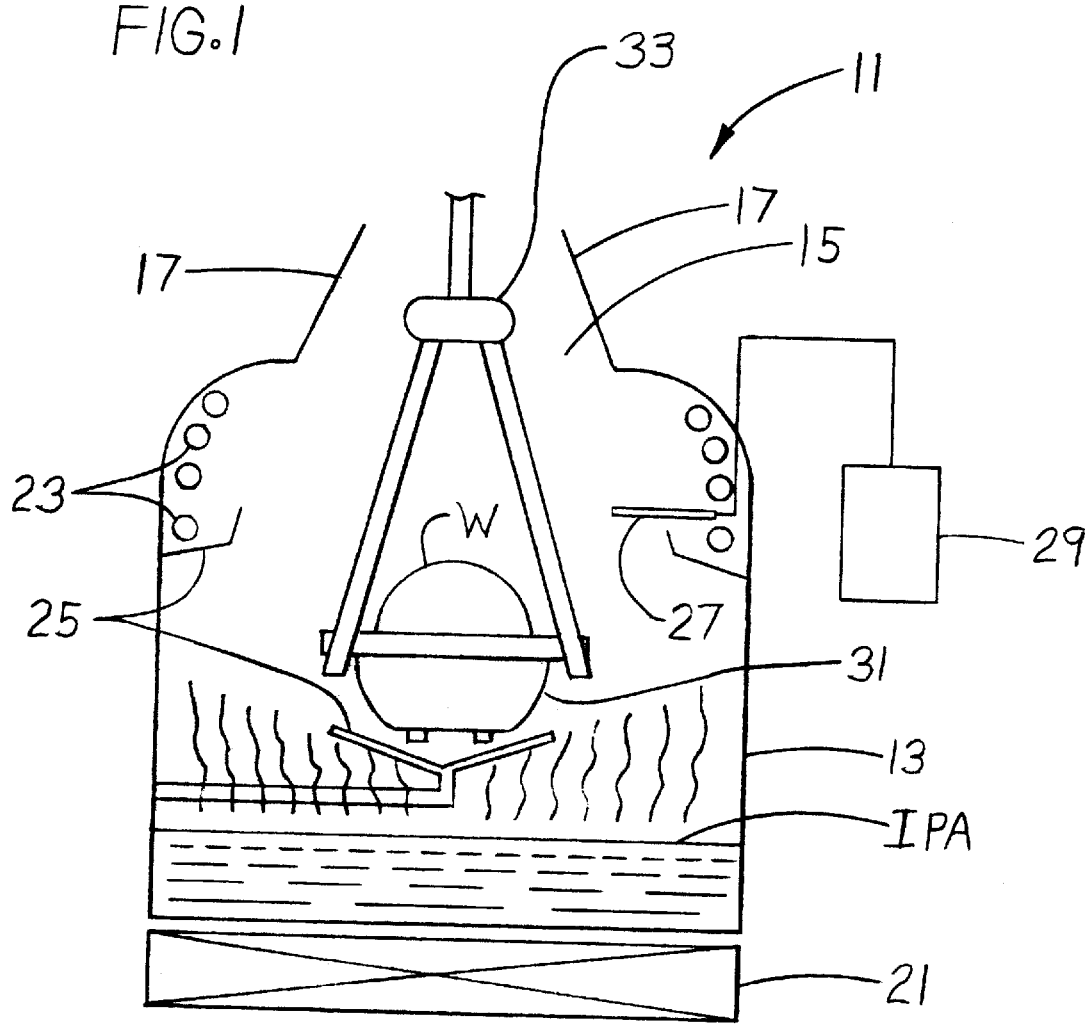

METHOD OF CALIBRATING A SEMICONDUCTOR WAFER DRYING APPARATUS

BACKGROUND OF THE INVENTION

The present invention relates generally to semiconductor wafer drying apparatus, and more particularly to methods of calibrating such drying apparatus.

Semiconductor wafers are generally prepared from a single-crystal ingot, such as a silicon ingot, which is sliced into individual wafers. The wafers are subjected to a number of wafer processing operations to reduce the thickness of the wafer, remove damage caused by the slicing operation, and to create a highly reflective surface.

The processing operations include cleaning the wafers in a liquid (e.g., de-ionized water) bath and then drying the wafers to inhibit formation of a residue on the surface of the wafer. The wafers may be dried in a batch drying apparatus. One type of batch drying apparatus, commonly referred to as an "IPA dryer", comprises a vessel for receiving the wafers, a heater for heating a liquid solvent, e.g., isopropyl alcohol (IPA), contained in the vessel, and condensing coils for condensing the IPA vapor. The heater heats the IPA to its boiling point so that a "cloud" of IPA vapor is formed in the vessel. A door of the vessel is opened, and a batch of wafers is introduced to the vessel and positioned above the surface of the liquid IPA. Due to the relatively cool temperature of the wafers, and due to the door of the vessel being opened, the temperature inside the vessel drops significantly, and the cloud dissipates. After the door is again closed, and after a "recovery time" in which the temperature in the vessel significantly increases, the vapor cloud should re-form to envelop the wafers so that, ideally, the liquid on the surface of the wafers is completely displaced by the IPA vapor and condensed IPA, as is known. After a period of time (referred to as processing time) has elapsed, the wafers are removed from the vessel and the liquid remaining on the wafer quickly evaporates.

Conventionally, the dryer is set at a predetermined heater temperature (typically the temperature recommended by the manufacturer) during processing of successive sets of wafers, and each set of wafers is processed inside the dryer for the same processing time. The heater temperature and processing time are not typically calibrated for the particular dryer or for the mass of the wafers to be processed. For example, the vapor cloud produced in the dryer is not monitored during processing. Over time, the efficiency of the dryer's heater may change so that less heat is delivered to the IPA by the heater. Because of the change, the "recovery time", i.e., the time for the cloud of IPA vapor to form after the door is closed, may be longer than expected and the vapor cloud may not substantially envelop the wafers. If envelopment does not occur, or does not occur for a sufficient time, the DI water may not be completely displaced from the wafers. In such cases, a residue may be left on the wafer which is not detectable through industry standard post-drying inspection. Such residue can cause serious defects, such as light point defects, which will only be detectable after the wafers undergo further downstream processing such as epitaxial treatment or chemical vapor deposition. On the other hand, if the heater processing time is set too long and the wafers are exposed to the vapor cloud for too long, or temperature is set too high and the IPA is overheated, other serious defects in the wafers may also occur. In either case, the defects may result in the wafers being rejected and may thereby reduce the yield of acceptable wafers. Thus, a method of calibrating individual IPA dryers is needed.

SUMMARY OF THE INVENTION

Among the several objects and features of the present invention may be noted the provision of a method for calibrating a semiconductor wafer dryer which ensures that wafers are completely dried after processing in the dryer; the provision of such a method which does not overheat wafers during processing in the dryer; and the provision of such a method which inhibits defects in semiconductor wafers processed in the dryer.

Briefly, a method of the invention for calibrating a semiconductor wafer drying apparatus including a heater and a vessel containing a solvent and capable of receiving semiconductor wafers comprises selecting a test heater temperature and a test processing time. A first set of wafers is placed in the vessel and the heater is operated at the test heater temperature so that a solvent vapor cloud is created in the vessel. The first set of wafers is monitored for substantial envelopment by the vapor cloud during the test processing time. Based on the monitoring step, at least one of the test heater temperature and the test processing time is adjusted to establish at least one operating parameter of an operating heater temperature parameter and an operating processing time parameter for processing successive sets of wafers so as to promote substantial vapor cloud envelopment of each set of wafers dried in the drying apparatus to inhibit defects in each set of wafers.

In another aspect of the invention, the method of calibrating the semiconductor wafer drying apparatus including a vessel containing a liquid comprises selecting a test heater temperature and a test processing time and placing a first set of wafers in the vessel. The heater is operated at the test heater temperature so that a vapor cloud is created in the vessel and the presence of the vapor cloud above the first set of wafers is monitored during the test processing time. Substantial envelopment of the first set of wafers is achieved when the vapor cloud is detected above the first set of wafers. Based on the monitoring step, at least one of the test heater temperature and the test processing time is adjusted to establish at least one operating parameter of an operating heater temperature parameter and an operating processing time parameter for processing successive sets of wafers.

In yet another aspect of the invention, the vessel contains a temperature sensor positioned above the first set of wafers and the method comprises, among other things, monitoring the temperature sensor for substantial envelopment of the first set of wafers by the vapor cloud during said test processing time. Based on the monitoring step, at least one of the test heater temperature and the test processing time is adjusted to establish operating parameters including an operating heater temperature parameter and an operating processing time parameter for processing successive sets of wafers so that the successive sets of wafers are substantially enveloped by the vapor cloud for a target time segment of at least about 30 seconds.

Other objects and features of the present invention will be in part apparent and in part pointed out hereinafter.

BRIEF DESCRIPTION OF THE DRAWINGS

FIG. 1 is a schematic of an IPA dryer used in a method of this invention.

Corresponding reference characters indicate corresponding parts throughout the several views of the drawings.

DETAILED DESCRIPTION OF THE PREFERRED EMBODIMENT

Referring now to the drawings and in particular to FIG. 1, an IPA dryer is generally designated by the reference numeral 11. A suitable dryer is a Model 28IFEL-M manufactured by S&K Products International, Chestnut Ridge, N.Y., though other types of dryers are suitable for use with this invention. The dryer 11 comprises a vessel 13 for receiving and drying semiconductor wafers W. The vessel 13 includes a doorway 15 in an upper portion of the vessel through which the wafers are received, and doors 17 for closing the doorway so that the vessel is substantially sealed during processing in the dryer 11. A bottom portion of the vessel 13 contains a quantity or pool of liquid solvent, such as isopropyl alcohol (IPA). A heater 21 is positioned in contact with the bottom of the vessel 13 for heating the IPA so that some of the IPA forms a vapor "cloud" in the vessel. The heater 21 may also be placed in contact with the side walls of the vessel 13. The heater 21 includes a thermostat (not shown) or similar device for controlling the temperature of the heater. Condensing coils 23 extend along the side walls in the upper portion of the vessel 13 for condensing the IPA vapor, and drip trays 25 are positioned beneath the coils to direct the condensed IPA which drips from the coils toward the pool of IPA. A thermocouple 27 (broadly, temperature sensor) is positioned inside the vessel 13 above the wafers and is used to measure the temperature inside the vessel. Note that the thermocouple 27 may be positioned above and to the side of the wafers as shown, or directly above the wafers. Such positioning allows the vapor cloud height to be monitored even when the doors 17 are closed during processing. The thermocouple 27 is connected to a digital readout 29 outside the vessel 13 for monitoring the temperature inside the vessel.

A wafer holder (commonly referred to as a "boat" and referred to as boat 31 hereinafter) containing a set of wafers is supported by a vertical lift mechanism 33 adapted to lower the boat into the vessel 13. During processing, the boat 31 is held by the lift mechanism 33 just above drip tray 25.

In a method of the invention, a test heater temperature is selected and the heater 21 is set at the test heater temperature. Typically, the heater 21 will be set at a temperature in the range of about 150° C. to about 280° C., which is recommended by the manufacturer for the dryer. A test processing time is also selected, typically in the range of about 200–250 seconds. For purposes of this description, the "processing time" begins when the doors 17 are closed after the wafers are placed in the vessel 13, and ends when the doors are opened for removing the wafers W. The test heater temperature and test processing time are typically the same as the heater temperature and processing time used for preceding sets of wafers W in the vessel 13. The doors 17 of the vessel are opened and a first set of wafers contained in the boat 31 are placed in the vessel. During the processing time, the heater temperature is equal to the test heater temperature.

The vessel 13 is monitored for substantial envelopment of the first set of wafers W by the vapor cloud during the test processing time. Substantial envelopment is considered to be achieved when the vapor cloud substantially envelops all the wafers W in the boat 31 and, preferably, when the cloud extends to between about one-half inch to about two inches above the first set of wafers, and more preferably about one inch. Accordingly, the thermocouple 27 is preferably positioned between about one-half inch to about two inches above the wafers, and more preferably about one inch above the wafers. The boiling point of IPA is about 81° C. so when the temperature at the thermocouple, i.e., above the wafers, is at least about 81° C., the vapor cloud has substantially enveloped the wafers W. Thus, the monitoring step is suitably performed by monitoring the readout 29. When the readout displays a temperature of at least 81° C., substantial envelopment of the wafers W has occurred. Substantial envelopment will continue until the doors 17 are opened after the processing time has elapsed since the heater 21 continues to heat the IPA. Monitoring may also be accomplished by visually monitoring the wafers W, such as through a sight glass (not shown) in the vessel 13. Monitoring may also be accomplished by sensors other than temperature sensors. The time of substantial envelopment of the wafers W is recorded. When the test processing time has elapsed, the doors 17 are opened, and the boat 31 is removed from the vessel 13.

In order to displace all of the DI water on the wafers W, the vapor cloud should substantially envelop the wafers for a preferred envelopment time (generally, target time segment) of at least about 30 seconds, more preferably at least about 60 seconds, more preferably at least about 90 seconds and even more preferably between about 100 and 150 seconds. Accordingly, if the envelopment time for the test wafers is less or more than the preferred envelopment time, an adjustment of at least one of the test heater temperature and test processing time is made to establish operating parameters including an operating heater temperature and/or an operating processing time for processing successive sets of wafers. For example, if the vapor cloud fails to envelop the first set of wafers for at least 30 seconds, the test heater temperature is adjusted to establish an operating heating temperature greater than the test heater temperature. Alternatively or in combination, the test processing time may also be adjusted to establish an operating processing time greater than the test processing time. In other words, both the time and temperature may be increased, or just one of the time and temperature may be increased. As a further example, if the vapor cloud fails to substantially envelop the first set of wafers during the processing time, the test heater temperature and/or the test processing time is likewise adjusted to establish an operating heating temperature or processing time greater than the test heater temperature or processing time. Conversely, test heater temperature and/or test processing time may be adjusted to establish a lower operating heating temperature or shorter processing time to avoid overheating the wafers W. Note that a successive test run or runs may be performed using the operating heating temperature and operating time established after the first set of wafers to ensure that envelopment time is as desired.

Monitoring substantial envelopment of the wafers W by the vapor cloud may also be performed indirectly by measurement of defects in a wafer or wafers after processing is completed. Such measurement will detect light point defects in the wafer caused by the DI water residue which occurs because the dryer 11 did not completely displace the DI water on the wafer. Note that such measurement may be done in addition to monitoring temperature or visually monitoring as discussed above, or may be done without monitoring temperature or visually monitoring. If substantial envelopment did not occur during the processing time, or if it did not occur for sufficient time, a greater number of defects will be seen in the wafers. Typically, defects in the wafer W caused by the DI water residue are not detected by industry standard inspection until after the wafer is subjected to epitaxial treatment or chemical vapor deposition (CVD).

Thus, this method of monitoring includes subjecting the wafers to epitaxial treatment or CVD, and then placing the wafer or wafers in an inspection device, such as an automated inspection device with laser Model CR80 available from ADE Corporation, Westwood, Mass. 02090-1806, suitable for measuring the light point defects in the wafer. Typically, a DI water residue will leave a pattern of light point defects on one or both surfaces of the wafer. The pattern is typically a streak of defects in one area of the wafer. Such a pattern will render the wafer W unacceptable to many wafer consumers and is typically accompanied by an unacceptable number of light point defects, such as more than 150 light point defects at about 0.2 microns at a layer thickness of at least about 1800 angstroms. If the pattern is detected, or the number of light point defects is unacceptable, the test processing time and/or the test temperature is adjusted upward and successive sets of wafers are processed at the higher value processing time or heater temperature. As discussed above, it is also possible for the processing time and heater temperature to be set too high. In such case, the vapor cloud will substantially envelop the wafers for more than the preferred time, but the wafers will have an unacceptable number of light point defects. In such case, the time or temperature is significantly higher than optimum, and the operating processing time and heater temperature should be set at significantly less than the test processing time and/or test temperature.

The method of this invention will preferably be performed at regular intervals, e.g. every week, on each dryer 11 in a facility. It is to be noted that each dryer is typically constructed differently, so that the heating efficiency of each dryer is different. Moreover, the heating efficiency of the dryers will degrade at different rates. Accordingly, the method is preferably performed on each dryer 11 and on a regular basis. Moreover, the data obtained for optimum operating heater temperature and processing time is at least in part dependent on the mass of the wafers processed. Thus, sets of wafers processed should have substantially similar mass as the test set of wafers. If the mass of the set of wafers must be changed, the method should be performed again.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method of calibrating a semiconductor wafer drying apparatus including a heater and a vessel containing a solvent and capable of receiving semiconductor wafers, the method comprising:
   selecting a test heater temperature and a test processing time,
   placing a first set of wafers in the vessel,
   operating the heater at said test heater temperature so that a solvent vapor cloud is created in the vessel,
   monitoring for substantial envelopment of said first set of wafers by the vapor cloud during said test processing time,
   said monitoring step including subjecting at least some of said first set of wafers to epitaxial treatment or chemical vapor deposition subsequent to said operating step and thereafter measuring defects in the wafers, and
   based on said monitoring step, adjusting at least one of said test heater temperature and said test processing time to establish at least one operating parameter of an operating heater temperature parameter and an operating processing time parameter for processing successive sets of wafers so as to promote substantial vapor cloud envelopment of each set of wafers dried in said drying apparatus to inhibit defects in each set of wafers.

2. A method as set forth in claim 1 wherein substantial envelopment of said first set of wafers is achieved when the vapor cloud extends to about 1 inch above said first set of wafers.

3. A method as set forth in claim 2 wherein said adjusting step includes establishing operating parameters such that successive sets of wafers are substantially enveloped by the vapor cloud for a target time segment of at least about 90 seconds.

4. A method as set forth in claim 1 wherein the monitoring step comprises monitoring temperature at a location in the vessel with a temperature sensor.

5. A method as set forth in claim 1 wherein the measuring step comprises measuring light point defects in at least one surface of the wafers.

6. A method as set forth in claim 5 wherein substantial envelopment is achieved when successive sets of wafers processed at the operating parameters have less than 150 light point defects at about 0.2 microns at a layer thickness of at least about 1800 angstroms.

7. A method as set forth in claim 1 wherein the monitoring step comprises visually monitoring the envelopment of the wafers by the vapor cloud during said test processing time.

8. A method as set forth in claim 1 wherein said adjusting step includes establishing a value of the operating heater temperature which is greater than that of the test heater temperature if the vapor cloud fails to envelop said first set of wafers for a target time segment of said test processing time.

9. A method as set forth in claim 1 wherein said adjusting step includes establishing a value of the operating processing time which is greater than the test processing time if the vapor cloud fails to envelop said first set of wafers for a target time segment of said test processing time.

10. A method as set forth in claim 1 wherein said method is performed at a regular interval.

11. A method as set forth in claim 1 wherein said successive sets of wafers have substantially similar mass as the test set of wafers.

12. A method of calibrating a semiconductor wafer drying apparatus including a heater and a vessel containing a liquid and capable of receiving semiconductor wafers, the method comprising:
   selecting a test heater temperature and a test processing time,
   placing a first set of wafers in the vessel,
   operating the heater at said test heater temperature so that a vapor cloud is created in the vessel,
   monitoring the presence of the vapor cloud above said first set of wafers during said test processing time, wherein substantial envelopment of the first set of wafers is achieved when the vapor cloud is detected above said first set of wafers,
   said monitoring step including subjecting at least some of said first set of wafers to epitaxial treatment or chemical vapor deposition subsequent to said operating step and thereafter measuring defects in the wafers, and based on said monitoring step, adjusting at least one of said test heater temperature and said test processing time to establish at least one operating parameter of an operating heater temperature parameter and an operating processing time parameter for processing successive sets of wafers so as to promote substantial vapor cloud envelopment of each set of wafers dried in said drying apparatus to inhibit defects in each set of wafers.

13. A method as set forth in claim 12 wherein the monitoring step includes monitoring a temperature sensor positioned about one inch above said first set of wafers, substantial envelopment being achieved when said temperature sensor detects a temperature of at least 80° Celsius.

14. A method as set forth in claim 12 wherein the measuring step comprises measuring light point defects in at least one surface of the wafers.

15. A method as set forth in claim 12 wherein the monitoring step includes visually monitoring the envelopment of the wafers by the vapor cloud during said test processing time.

16. A method as set forth in claim 12 wherein said adjusting step includes establishing operating parameters such that successive sets of wafers are substantially enveloped by the vapor cloud for a target time segment of at least about 90 seconds.

17. A method as set forth in claim 12 wherein said adjusting step includes establishing a value of the operating heater temperature parameter which is greater than that of the test heater temperature parameter if the vapor cloud fails to envelop said first set of wafers for a target time segment of said test processing time.

18. A method of calibrating a semiconductor wafer drying apparatus including a heater, a vessel containing a liquid, a temperature sensor and capable of receiving semiconductor wafers, the method comprising:

selecting a test heater temperature and a test processing time, placing a first set of wafers in the vessel, operating the heater at said test heater temperature so that a vapor cloud is created in the vessel, monitoring the temperature sensor inside said vessel for substantial envelopment of said first set of wafers by the vapor cloud during said test processing time, the temperature sensor being positioned above said first set of wafers, and based on said monitoring step, adjusting at least one of said test heater temperature and said test processing time to establish operating parameters including an operating heater temperature parameter and an operating processing time parameter for processing successive sets of wafers so that the successive sets of wafers are substantially enveloped by the vapor cloud for a target time segment of at least about 30 seconds.

19. A method as set forth in claim 18 wherein substantial envelopment of said first set of wafers is achieved when the vapor cloud extends to about 1 inch above said first set of wafers.

20. A method as set forth in claim 18 wherein the monitoring step comprises measuring defects in the wafers subsequent to drying in said drying apparatus.

21. A method as set forth in claim 20 wherein the measuring step comprises measuring light point defects in at least one surface of the wafers.

22. A method as set forth in claim 21 wherein substantial envelopment is achieved when successive sets of wafers processed at the operating parameters have less than 150 light point defects at about 0.2 microns at a layer thickness of at least about 1800 angstroms.

23. A method as set forth in claim 20 wherein the monitoring step includes subjecting at least some of said first set of wafers to epitaxial treatment or chemical vapor deposition prior to measuring defects in the wafer.

24. A method as set forth in claim 18 wherein the monitoring step comprises visually monitoring the envelopment of the wafers by the vapor cloud during said test processing time.

25. A method as set forth in claim 18 wherein said adjusting step includes establishing operating parameters such that successive sets of wafers are substantially enveloped by the vapor cloud for a target time segment of at least about 90 seconds.

26. A method as set forth in claim 18 wherein said adjusting step includes establishing a value of the operating heater temperature which is greater than that of the test heater temperature if the vapor cloud fails to envelop said first set of wafers for a target time segment of said test processing time.

27. A method as set forth in claim 18 wherein said adjusting step includes establishing a value of the operating processing time which is greater than the test processing time if the vapor cloud fails to envelop said first set of wafers for a target time segment of said test processing time.

28. A method as set forth in claim 18 wherein said method is performed at a regular interval.

29. A method as set forth in claim 18 wherein said successive sets of wafers have substantially similar mass as the test set of wafers.

* * * * *